(12) United States Patent
Lee et al.

(10) Patent No.: US 10,181,682 B2
(45) Date of Patent: Jan. 15, 2019

(54) UNGROUNDED SHIELD FOR AN ELECTRICAL CONNECTOR

(71) Applicant: Intel Corporation, Santa Clara, CA (US)

(72) Inventors: Jaejin Lee, Beaverton, OR (US);
Hao-Han Hsu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/392,054

(22) Filed: Dec. 28, 2016

(65) Prior Publication Data

US 2018/0183185 A1 Jun. 28, 2018

(51) Int. Cl.
*H01R 13/648* (2006.01)
*H01R 13/6581* (2011.01)
*H01R 13/6598* (2011.01)
*H01R 43/26* (2006.01)

(52) U.S. Cl.
CPC ..... *H01R 13/6581* (2013.01); *H01R 13/6598* (2013.01); *H01R 43/26* (2013.01); *H01R 2201/06* (2013.01)

(58) Field of Classification Search
CPC .............. H01R 13/648; H01R 13/6599; H01R 13/658; H01R 13/6585; H01R 13/6594
USPC ................ 439/607.01, 607.34, 489, 660
See application file for complete search history.

(56) References Cited

U.S. PATENT DOCUMENTS

| | | | |
|---|---|---|---|
| 6,174,198 B1 * | 1/2001 | Wu | H01R 13/659 439/541.5 |
| 7,014,475 B1 * | 3/2006 | Mongold | H01R 12/721 439/67 |
| 7,294,024 B2 * | 11/2007 | Hammond, Jr. | H01R 13/6471 439/607.05 |
| 7,632,148 B1 * | 12/2009 | Kawamura | H01R 13/5221 439/607.41 |
| 8,369,513 B2 * | 2/2013 | Hammond, Jr. | H04B 3/32 379/417 |
| 2004/0235348 A1 | 11/2004 | Murayama | |
| 2005/0020125 A1 | 1/2005 | Huang | |
| 2005/0186844 A1 * | 8/2005 | Hammond, Jr. | H01R 13/518 439/607.26 |
| 2006/0141865 A1 * | 6/2006 | Su | H01R 27/00 439/607.01 |

(Continued)

FOREIGN PATENT DOCUMENTS

JP 2011150848 A 8/2011
WO 2011090928 A1 7/2011

OTHER PUBLICATIONS

International Search Report and Written Opinion issued in PCT Application No. PCT/US2017/062197 dated Feb. 28, 2018; 11 pages.

*Primary Examiner* — Abdullah Riyami
*Assistant Examiner* — Thang Nguyen
(74) *Attorney, Agent, or Firm* — Patent Capital Group (57) ABSTRACT

Particular embodiments described herein provide for a connector shield that can include a main body, a shield portion to shield electromagnetic radiation from a connector, and a support portion. The main body can be removably secured to the connector. The shield portion includes lossy material and the shield portion is not grounded. The connector can include connection lines and the connection lines are at least partially inside a cavity of the shield portion.

21 Claims, 7 Drawing Sheets

(56) References Cited

U.S. PATENT DOCUMENTS

| | | | |
|---|---|---|---|
| 2010/0035469 A1* | 2/2010 | Matsuzaki | H01R 13/648 |
| | | | 439/607.01 |
| 2011/0117781 A1* | 5/2011 | Stoner | H01R 13/6587 |
| | | | 439/607.01 |
| 2013/0065454 A1* | 3/2013 | Milbrand, Jr. | H01R 12/724 |
| | | | 439/676 |
| 2014/0004726 A1* | 1/2014 | Cartier, Jr. | H01R 12/712 |
| | | | 439/78 |
| 2014/0073182 A1* | 3/2014 | Ardisana, II | B29C 45/14065 |
| | | | 439/607.01 |
| 2015/0340817 A1 | 11/2015 | Li et al. | |
| 2016/0006198 A1* | 1/2016 | Ueda | H01R 13/405 |
| | | | 439/607.01 |
| 2016/0181736 A1 | 6/2016 | Hsu et al. | |
| 2017/0271822 A1* | 9/2017 | Zhang | H01R 12/7082 |
| 2018/0166809 A1* | 6/2018 | Brogan | H01R 12/714 |

* cited by examiner

UNGROUNDED SHIELD FOR AN ELECTRICAL CONNECTOR

TECHNICAL FIELD

The present disclosure relates generally to the field of computers, and more particularly, to a shield for a connector.

BACKGROUND

Most, electronic devices include some type of an electrical connector. An electrical connector, is an electro-mechanical device used to join electrical terminations and create an electrical circuit. Electrical connectors consist of plugs (male-ended) and jacks (female-ended). The connection may be temporary, as for portable equipment, require a tool for assembly and removal, or serve as a permanent electrical joint between two wires or devices. An adapter can be used to effectively bring together dissimilar connectors. There are many different types of electrical connectors but one feature most have in common is that they each, to some degree emit some type of noise or interference.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

The figures of the drawings are not necessarily drawn to scale, as their dimensions can be varied considerably without departing from the scope of the present disclosure.

DETAILED DESCRIPTION

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

Most electrical connectors emit some type of noise or interference. For example, peripheral component interconnect (PCI), PCI-express, embedded display port (eDP), universal serial bus (USB), serial advanced technology attachment (SATA), parallel ATA (SATA), a double data rate fourth generation (DDR4), ect. typically generate a relatively significant amount of electromagnetic radiation (EMR) and noise (also called radio frequency radiation (RFR) and noise when in the radio frequency spectrum). Note that RFR is a type or subset of EMR and the term "EMR" is to include RFR. In addition, as used herein, the term "EMR" includes electromagnetic radiation, interference, and/or noise.

EMR is a disturbance generated by a source (e.g., an electrical connector) that affects an electrical circuit by electromagnetic induction, electrostatic coupling, or conduction. EMR may cause performance degradation and failure of electronic components in an electronic device as well as performance degradation and failure of radio specification requirements. In the case of a data path, these effects can range from an increase in error rate to a total loss of the data. As the form factor of electronic devices becomes smaller and the form factor of personal computing devices transform from a clamshell device into a tablet or two-in-one (2-in-1) device, electrical components and radio frequency (RF) antennas are typically placed in close proximity to the electrical connectors. Because of the noise and interference generated by the electrical connectors, EMR, and especially RFR radio frequency interference (RFI), risk management becomes a very important system design criteria.

Currently, to mitigate the EMR from the electrical connector, the most common solution is fundamentally a faraday cage and requires many grounding points between a shielding enclosure and a printed circuit board (PCB) ground plane. One issue is that the faraday cage can be difficult to properly ground and an improperly grounded faraday cage becomes a radiating aperture, resulting in an increase in RF noise emission. In addition, design and implementation of the faraday cage is limited by the motherboard trace routing. Further, the required grounding points around the faraday cage may block signal routing on the PCB and result in substantial routing problems. Also, EMR issues are typically identified at a very late stage of the product development where adopting the faraday cage can be difficult since adding grounding points requires a board re-spin. What is needed is a shield for an electrical connector that does not require grounding points.

Disclosed herein are systems, apparatuses, and methods to enabling a connector shield with no grounding points to reduce and shield the EMR, in particular, RFR and noise, caused by the electrical connector. As used herein, the terms "shield the EMR," "EMR shielding," "shield," "shielding" and other variations, include containing, reducing or eliminating the EMR outside the connector shield and/or shielding nearby components from the EMR from the connector.

In an example, the connector shield can include lossy magnetic material to implement the EMR shielding. In one example, the connector shield can be a removable snap on EMR shield. The connector shield is not a conventional faraday cage and does not require ground points to suppress EMR. In addition, the connector shield does not cause significant signal routing difficulties and is applicable to almost any type of connector. Further, the connector shield can be used at the late product stage or after production of the board because it can be snapped on an existing unshielded connector without any board modification.

The terms "over," "under," "between," and "on" as used herein refer to a relative position of one material layer or component with respect to other layers or components. For example, one device, component, or layer disposed over or under another device, component, or layer may be directly in contact with the other device, component, or layer or may have one or more intervening devices, components, or layers. Moreover, one device, component, or layer disposed between two devices, components, or layers may be directly in contact with the two devices, components, or layers or may have one or more intervening devices, components, or layers. In contrast, a first device, component, or layer "on" a second device, component, or layer is in direct contact with that second device, component, or layer. Similarly, unless explicitly stated otherwise, one feature disposed between two features may be in direct contact with the adjacent features or may have one or more intervening device, component, or layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

Figure 1A:
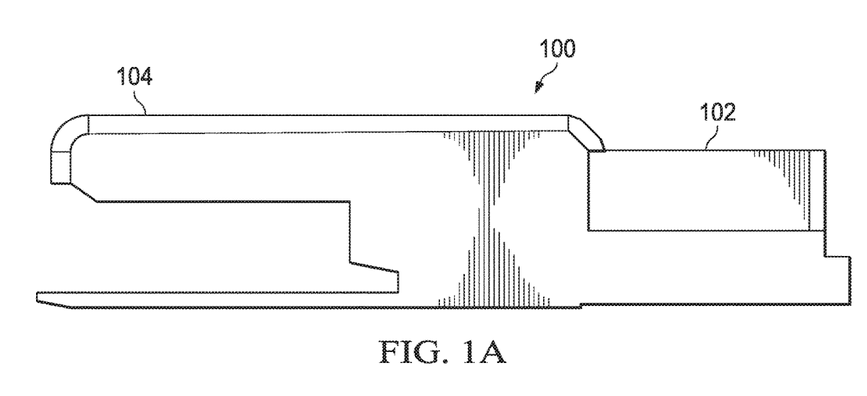
FIG. 1A is a simplified block diagram illustrating an embodiment of a shield for a connector, in accordance with one embodiment of the present disclosure.
Figure 1B:
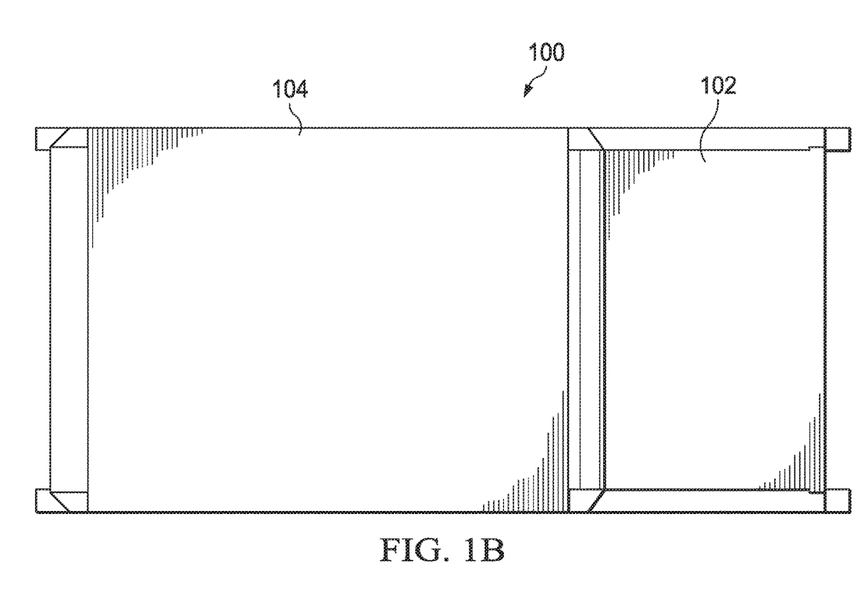
FIG. 1B is a simplified block diagram illustrating an embodiment of a shield for a connector, in accordance with one embodiment of the present disclosure.
Figure 1C:
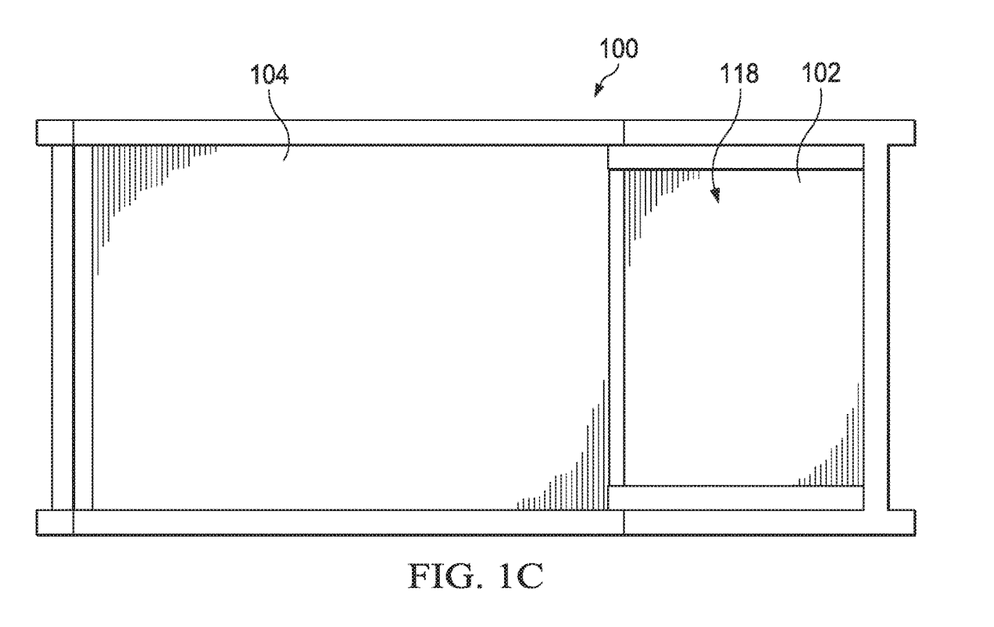
FIG. 1C is a simplified block diagram illustrating an embodiment of a shield for a connector, in accordance with one embodiment of the present disclosure.

FIGS. 1A-1C are a simplified block diagrams of a connector shield 100. Connector shield 100 can included a shield portion 102 and a support portion 104. Shield portion 102 can include lossy material to help mitigate or shield EMR from an electrical connector. Shield portion 102 can include a cavity 118. Cavity 118 can be configured to allow shield portion 102 to fitted over connection lines or a source of EMR from an electrical connector. Support portion 104 can be configured to provide support for shield portion 102 and allow connector shield 100 to be removably secured to an electrical connector.

In an example, shield portion 102 and support portion 104 are made from the same or similar material and may be a solid piece. In another example, shield portion 102 and support portion 104 are made from two different materials. More specifically, shield portion 102 may be comprised of a lossy material while support portion 104 may be plastic. Lossy material (sometimes referred to as lossy medium) includes a material that dissipates energy of electromagnetic or acoustic energy passing through it. Some examples of lossy materials are electrically conductive material, carbon, iron, carbonyl iron powder, sendust, ferrites, magnetic alloys, carbon-impregnated rubber, metal foils, metal clad materials including iron, nickel, and iron/nickel compositions, alumina, sapphire, silica, titanium oxide, or some other similar material, and/or combinations thereof. In some examples, the lossy material can be combined with other materials to achieve a desired effect. Both shield portion 102 and support portion 104 can have a profile that allows connector shield 100 to be removably secured to an electrical connector (e.g., peripheral component interconnect (PCI), PCI-express, embedded display port (eDP), universal serial bus (USB), serial advanced technology attachment (SATA), parallel ATA (PATA), a double data rate fourth generation (DDR4), super-speed USB inter-chip (SSIC), high definition multimedia interface (HDMI), display port (DP), thunderbolt, ect.) and help at least partially shield nearby components from the EMR from the electrical connector.

In an example, connector shield 100 can be configured as a floating lossy EMR shield that fits onto an electrical connector. High magnetic loss properties of shield portion 102 can help at least partially attenuate EMR and dissipate the EMR before it radiates and couples to other objects in a system that includes the electrical connector. Since shield portion 102 does not form a faraday cage for connector shielding, grounding points from connector shield 100 to a board are not necessary. This allows connector shield 100 to effectively suppress EMI, even in densely routed areas, without the need of ground points.

Figure 2:
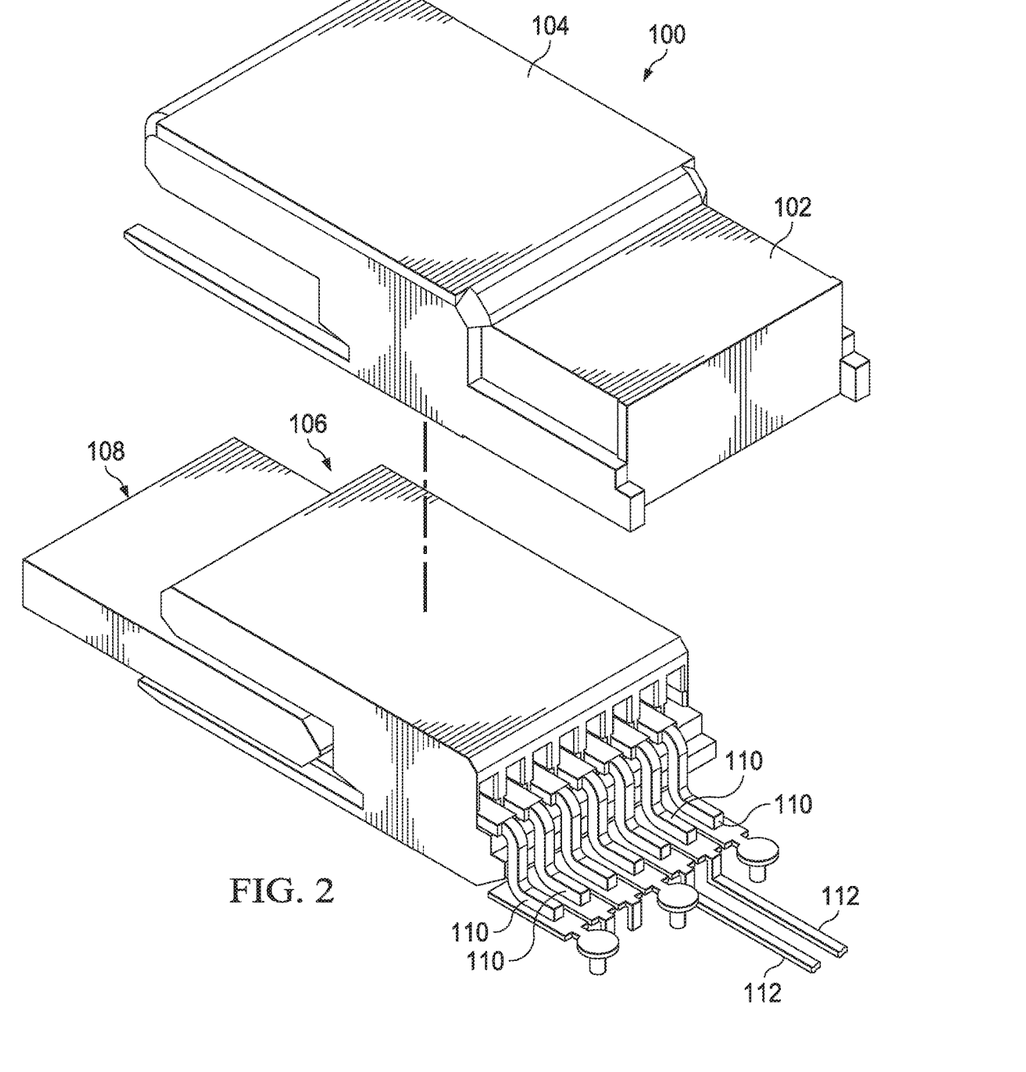
FIG. 2 is a simplified block diagram illustrating a perspective view of an embodiment of a shield for a connector, in accordance with one embodiment of the present disclosure.

Turning to FIG. 2, FIG. 2 illustrates one embodiment of connector shield 100 being placed over a connector 106. Connector 106 is an electrical connector that can emit or otherwise cause some type of EMR and includes, but is not limited to, PCI, PCI-express, eDP, USB, SATA, PATA), DDR4, SSIC, HDMI, DP, and Thunderbolt. Connector 106 can include one or more connections 110 (e.g., connection lines). Mating connector 108 can couple to connector 106. Connections 110 can transfer data from connector 106 and mating connector 108 (if coupled to connector 106) to signal lines 112. Typically, this data transfer is what can cause the EMR from connector 106.

Figure 3:
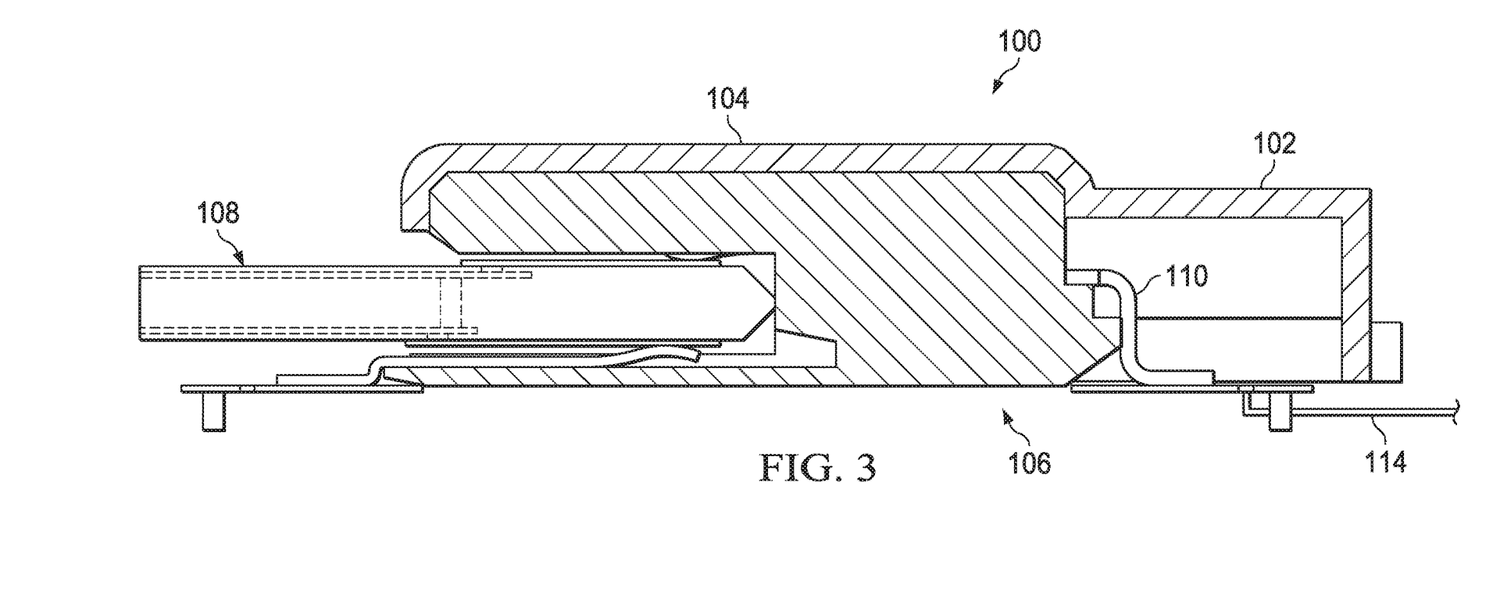
FIG. 3 is a simplified block diagram illustrating an embodiment of a shield for a connector, in accordance with one embodiment of the present disclosure.

Turning to FIG. 3, FIG. 3 illustrates one embodiment of connector shield 100 over connector 106. As illustrated in FIG. 3, shield portion 102 can surround connections 110 and, at least partially, shield the EMR from the rest of the system. Also, connector shield 100 is not coupled to, attached, or otherwise grounded to ground plane 114.

Figure 4:
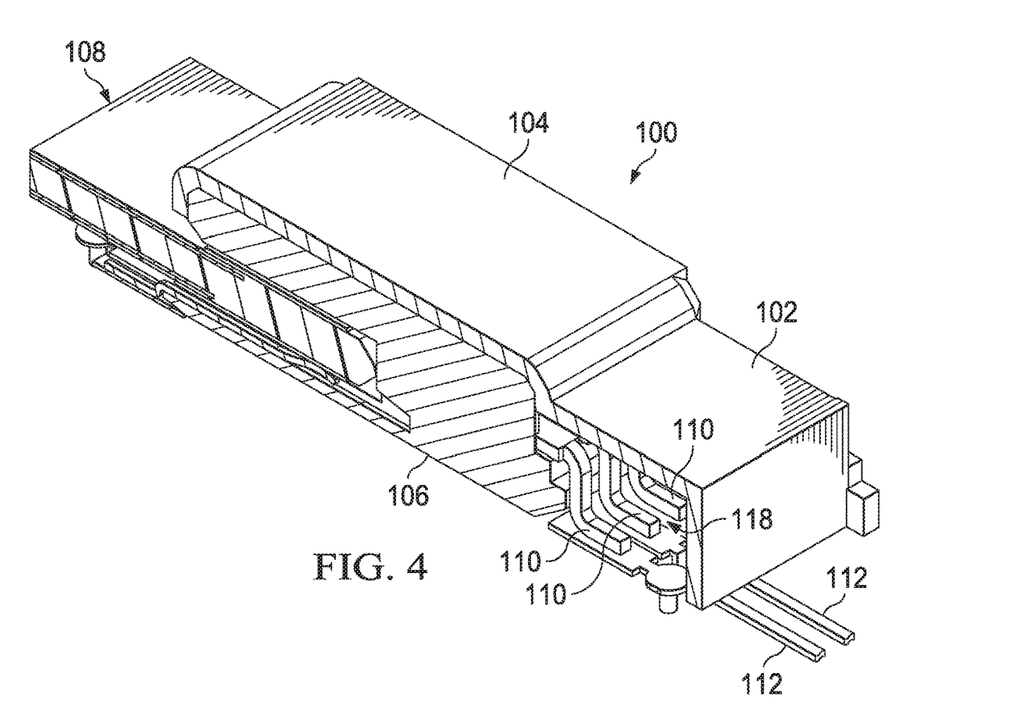
FIG. 4 is a simplified block diagram illustrating an embodiment of a shield for a connector, in accordance with one embodiment of the present disclosure.

Turning to FIG. 4, FIG. 4 illustrates a cut away perspective view of one embodiment of connector shield 100 over connector 106. As illustrated in FIG. 4, connections 110 are contained within cavity 118 of shield portion 102. Support portion 104 helps to secure connector shield 100 to connector 106 and does not interfere with the coupling and decoupling of mating connector 108 to connector 106. Note that the illustrated type of connector 106 and profile of connector shield 110 is for illustration purposes only and the examples and discussion herein are not intended to be exhaustive or to limit the scope of this disclosure. The specific illustration and implementations of, and examples for, the embodiments disclosed herein are for illustrative purposes, various equivalent modifications, such as a different profile of connector shield 100, are possible within the scope of the disclosure, as those skilled in the relevant art will recognize.

Figure 5:
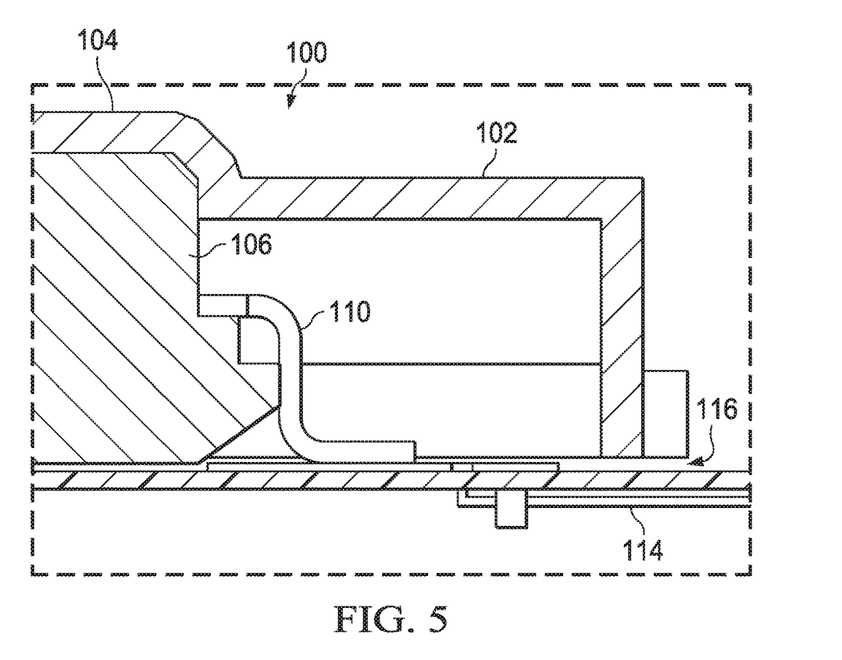
FIG. 5 is a simplified block diagram illustrating an embodiment of a portion of shield for a connector, in accordance with one embodiment of the present disclosure.

Turning to FIG. 5, FIG. 5 illustrates a cut away perspective view of one embodiment of connector shield 100 over connector 106. As illustrated in FIG. 5, shield portion 102 can surround connections 110 such that connections are within cavity 118 and at least partially shield the EMR from the rest of the system without being coupled to, attached, or otherwise grounded to ground plane 114. In an example, support portion 104 can allow shield portion 102 to float above ground plane 114 such that there is a gap 116 between shield portion 102 and ground plane 114.

Figure 6:
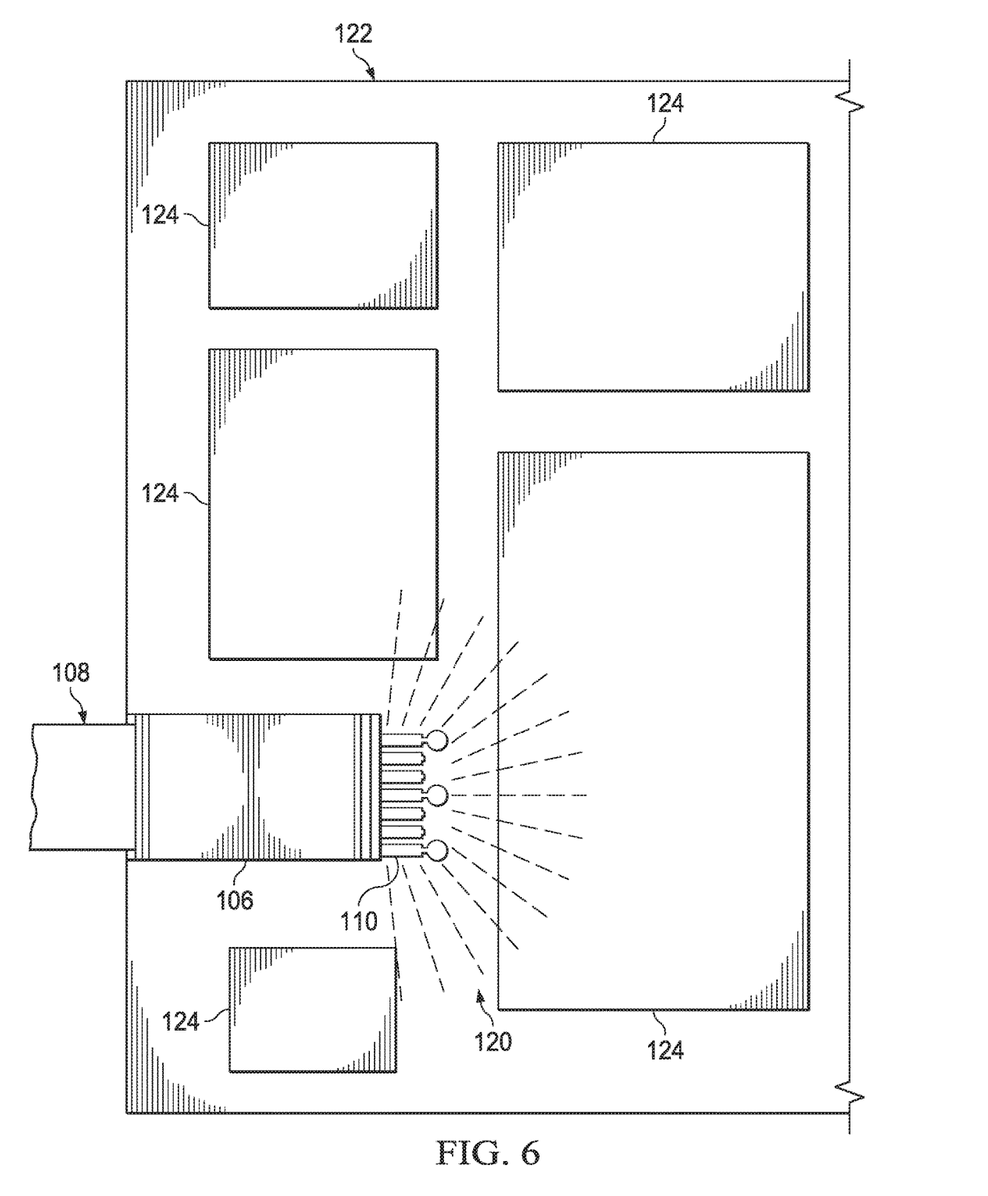
FIG. 6 is a simplified block diagram illustrating an embodiment of a connector, in accordance with one embodiment of the present disclosure.

Turning to FIG. 6, FIG. 6 is a simplified block diagram of an electronic device 122. Electronic device 122 can include connector 106 and electronic components 124. As illustrated in FIG. 6, connector 106 can be coupled to mating connector 108. Data that flows from connector 106 on connections 110 can cause interference 120 (e.g., EMI). Interference 120 can sometimes interfere with electronic components 124. For example, if electronic components 124 are or include a WiFi antenna and interference 120 is RFR or RFI, then interference 120 can interfere with the WiFi antenna and degrade reception.

Figure 7:
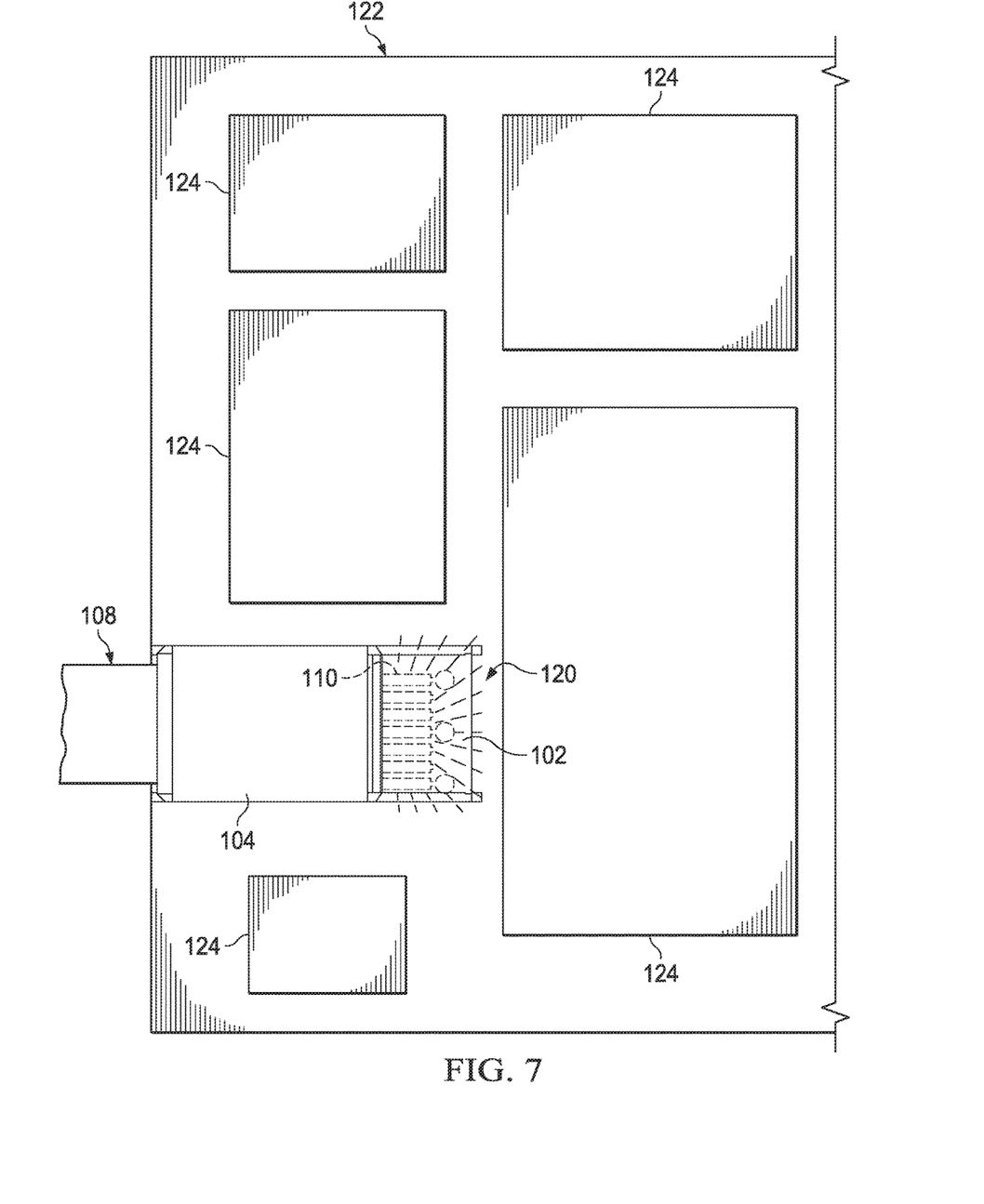
FIG. 7 is a simplified block diagram illustrating an embodiment of a shield for a connector, in accordance with one embodiment of the present disclosure.

Turning to FIG. 7, FIG. 7 is a simplified block diagram of an electronic device 122. As illustrated in FIG. 7, connector shield 100 has been placed over at least a portion of connector 106. As a result, interference 120 from connector 106, and in particular from connections 110, is at least partially contained inside shield portion 102 of connector shield 100. In other words, connector shield 100 has shielded interference 120. This helps to reduce interference 120 and its effects on electronic components 124.

In various embodiments, electronic device 122 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, electronic device 122 may be any other electronic device that processes data and includes connector 106 or an interconnect that produces EMR. Connector 106 may be part of an IC package or chip.

Although a few examples of materials from which the substrate may be formed are described here, any material that may serve as a foundation upon which a connector shield may be built falls within the spirit and scope of the embodiments disclosed herein.

The above description of illustrated implementations, including what is described in the Abstract, is not intended to be exhaustive or to limit the scope of the disclosure to the precise forms disclosed. While specific implementations of, and examples for, the embodiments disclosed herein are described herein for illustrative purposes, various equivalent modifications are possible within the scope of the disclosure, as those skilled in the relevant art will recognize.

Other Notes and Examples

Example 1 is an apparatus including a main body wherein the main body can be removably secured to a connector that is part of an electronic device, where operation of the connector causes the emission of electromagnetic radiation from the connector. The main body can include a shield portion, at least partially over the connector, to shield the electromagnetic radiation and a support portion over a portion of the connector.

In Example 2, the subject matter of Example 1 can optionally include where the shield portion includes lossy material.

In Example 3, the subject matter of any one of Examples 1-2 can optionally include where the apparatus is not grounded.

In Example 4, the subject matter of any one of Examples 1-3 can optionally include where the apparatus is not coupled to a ground plane.

In Example 5, the subject matter of any one of Examples 1-4 can optionally include where there is a gap between the shield portion and the ground plane.

In Example 6, the subject matter of any one of Examples 1-5 can optionally include where the connector includes connection lines and the connection lines are at least partially inside a cavity of the shield portion.

In Example 7, the subject matter of any one of Examples 1-6 can optionally include where the support portion helps support the shield portion over connection lines on the connector.

Example 8, is a method can include removably securing a connector shield on a connector, wherein operation of the connector causes the emission of electromagnetic radiation from the connector, where the connector shield includes a shield portion, at least partially over the connector, to shield the electromagnetic radiation and a support portion removably coupled to the connector.

In Example 9, the subject matter of Example 8 can optionally include where the shield portion includes lossy material.

In Example 10, the subject matter of Examples 8-9 can optionally include where the connector shield is not grounded.

In Example 11, the subject matter of any one of Examples 8-10 can optionally include where the connector shield is not coupled to a ground plane.

In Example 12, the subject matter of any one of Examples 8-11 can optionally include where there is a gap between the shield portion and the ground plane.

In Example 13, the subject matter of any one of Examples 8-12 can optionally include where the connector includes connection lines and the connection lines are at least partially inside a cavity of the shield portion.

In Example 14, the subject matter of any one of Examples 8-13 can optionally include where the support portion helps support the shield portion over connection lines on the connector.

Example 15, is a computing device including a connector, where operation of the connector causes the emission of electromagnetic radiation from the connector, one or more electronic components proximate to the connector, and a connector shield on the connector. The connector shield can include a shield portion to shield the one or more electronic components from the electromagnetic radiation from the connector and a support portion removably coupled to the connector.

In Example 16, the subject matter of Example 16 can optionally include where the shield portion includes lossy material.

In Example 17 the subject matter of Examples 15-16 can optionally include where the connector shield is not grounded.

In Example 18, the subject matter of Examples 15-17 can optionally include where the connector shield is not coupled to a ground plane.

In Example 19, the subject matter of any one of the Examples 15-18 can optionally include where here is a gap between the shield portion and the ground plane.

In Example 20, the subject matter of any one of the Examples 15-19 can optionally include where the connector includes connection lines and the connection lines are at least partially inside a cavity of the shield portion.

In Example 21, the subject matter of any one of the Examples 15-20 can optionally include where the support portion helps support the shield portion over connection lines on the connector.

Example 22 is a printed circuit board including a connector, wherein operation of the connector causes the emission of electromagnetic radiation from the connector, one or more electronic components proximate to the connector, where one of the one or more electronic components is an antenna, a ground plane, and a connector shield on the connector. The connector shield can include a shield portion to shield the one or more electronic components from the electromagnetic radiation from the connector, wherein the shield portion is not coupled to a ground plane and a support portion removably coupled to the connector.

In Example 23, the subject matter of Example 23 can optionally include where the shield portion includes lossy material.

In Example 24, the subject matter of Examples 22-23 can optionally include where there is a gap between the shield portion and the ground plane.

In Example 25, the subject matter of Examples 22-24 can optionally include where the connector includes connection lines and the connection lines are at least partially inside a cavity of the shield portion.

The invention claimed is:

1. An apparatus comprising:
  a connector shield, wherein the connector shield can be removably secured to an electrical connector that is part of an electronic device, wherein operation of the electrical connector causes the emission of electromagnetic radiation from the electrical connector, wherein the apparatus is not grounded, wherein the connector shield includes:
    a shield portion, at least partially fitted over the electrical connector, to shield the electromagnetic radiation; and
    a support portion over a portion of the electrical connector.

2. The apparatus of claim 1, wherein the shield portion includes lossy material.

3. The apparatus of claim 1, wherein the apparatus is not coupled to a ground plane.

4. The apparatus of claim 3, wherein there is a gap between the shield portion and the ground plane.

5. The apparatus of claim 1, wherein the electrical connector includes connection lines and the connection lines are at least partially inside a cavity of the shield portion.

6. The apparatus of claim 1, wherein the support portion helps support the shield portion over connection lines on the electrical connector.

7. A method of using a connector shield, the method comprising:
  removably securing the connector shield on an electrical connector, wherein operation of the electrical connector causes the emission of electromagnetic radiation from the electrical connector, wherein the connector shield is not grounded, wherein the connector shield includes:
    a shield portion, at least partially fitted over the electrical connector, to shield the electromagnetic radiation; and
    a support portion removably coupled to the electrical connector.

8. The method of claim 7, wherein the shield portion includes lossy material.

9. The method of claim 7, wherein the connector shield is not coupled to a ground plane.

10. The method of claim 9, wherein there is a gap between the shield portion and the ground plane.

11. The method of claim 7, wherein the electrical connector includes connection lines and the connection lines are at least partially inside a cavity of the shield portion.

12. The method of claim 7, wherein the support portion helps support the shield portion over connection lines on the electrical connector.

13. A computing device comprising:
  an electrical connector, wherein operation of the electrical connector causes the emission of electromagnetic radiation from the electrical connector;
  one or more electronic components proximate to the electrical connector; and
  a connector shield on the electrical connector, wherein the connector shield is not grounded, wherein the connector shield includes:
    a shield portion to shield the one or more electronic components from the electromagnetic radiation from the electrical connector; and
    a support portion removably coupled to the electrical connector.

14. The computing device of claim 13, wherein the shield portion includes lossy material.

15. The computing device of claim 13, wherein the connector shield is not coupled to a ground plane.

16. The computing device of claim 15, wherein there is a gap between the shield portion and the ground plane.

17. The computing device of claim 13, wherein the electrical connector includes connection lines and the connection lines are at least partially inside a cavity of the shield portion.

18. The computing device of claim 13, wherein the support portion helps support the shield portion over connection lines on the electrical connector.

19. A connector shield on an electrical connector on a printed circuit board, the connector shield comprising:
  a shield portion to shield one or more electronic components from electromagnetic radiation from the electrical connector, wherein the connector shield is not grounded, wherein there is a gap between the shield portion and a ground plane of the printed circuit board; and
  a support portion removably coupled to the electrical connector.

20. The connector shield of claim 19, wherein the shield portion includes lossy material.

21. The connector shield of claim 19, wherein the electrical connector includes connection lines and the connection lines are at least partially inside a cavity of the shield portion.

* * * * *